(12) United States Patent
Reiffenrath et al.

(10) Patent No.: US 9,521,704 B2
(45) Date of Patent: Dec. 13, 2016

(54) HOUSING FOR A MOBILE TELEPHONE

(71) Applicant: P3 Communications GmbH, Aachen (DE)

(72) Inventors: Jan Matti Reiffenrath, Aachen (DE); Peter Seidenberg, Aachen (DE)

(73) Assignee: P3 Communications GmbH, Aachen (DE)

( * ) Notice: Subject to any disclaimer, the term of this patent is extended or adjusted under 35 U.S.C. 154(b) by 0 days.

(21) Appl. No.: 14/994,055

(22) Filed: Jan. 12, 2016

(65) Prior Publication Data

US 2016/0205723 A1    Jul. 14, 2016

(30) Foreign Application Priority Data

Jan. 12, 2015  (DE) .................. 10 2015 000 062
Jan. 14, 2015  (DE) .................. 10 2015 100 519

(51) Int. Cl.
| | | |
|---|---|---|
| *H04M 1/02* | (2006.01) | |
| *H01Q 1/52* | (2006.01) | |
| *H04W 88/06* | (2009.01) | |
| *H04M 1/11* | (2006.01) | |
| *H04W 24/08* | (2009.01) | |
| *G01R 29/10* | (2006.01) | |

(52) U.S. Cl.
CPC ............ *H04W 88/06* (2013.01); *G01R 29/105* (2013.01); *H01Q 1/526* (2013.01); *H04M 1/026* (2013.01); *H04M 1/0293* (2013.01); *H04M 1/11* (2013.01); *H04W 24/08* (2013.01)

(58) Field of Classification Search
CPC ...... G01R 29/105; H01Q 1/243; H01Q 1/273; H01Q 1/526; H01Q 7/08; H04M 1/026; H04M 1/0293; H04M 1/11; H04W 24/08; H04W 88/06; H05K 9/0045
See application file for complete search history.

(56) References Cited

U.S. PATENT DOCUMENTS

| | | |
|---|---|---|
| 6,657,214 B1 | 12/2003 | Foegelle et al. |
| 2003/0057131 A1 | 3/2003 | Diaferia |

(Continued)

FOREIGN PATENT DOCUMENTS

| | | |
|---|---|---|
| DE | 199 12 232 A1 | 3/1999 |
| DE | 299 23 548 U1 | 2/2001 |

(Continued)

OTHER PUBLICATIONS

German Office Action issued on Apr. 22, 2015 for Application No. 10 2015 100 519.0.

(Continued)

*Primary Examiner* — Matthew Sams
(74) *Attorney, Agent, or Firm* — Knobbe Martens Olson & Bear, LLP

(57) ABSTRACT

Aspects of the innovations herein relates to a housing having a housing wall comprising a polymer including electrically conductive particles, wherein an inner chamber is provided in the housing, and is formed and enclosed by the housing wall and into which a mobile telephone may be inserted. In some implementations, the housing wall may be designed to attenuate a mobile radio signal of the mobile telephone, such as by ≥3 dB, as compared to unobstructed propagation, on the side of the housing wall facing away from the inner chamber.

20 Claims, 2 Drawing Sheets

(56) References Cited

U.S. PATENT DOCUMENTS

| | | |
|---|---|---|
| 2004/0165369 A1 | 8/2004 | Lionetta et al. |
| 2006/0109188 A1* | 5/2006 | Ikeda .................. H01Q 1/243 343/718 |
| 2012/0055824 A1 | 3/2012 | Nash |
| 2012/0176907 A1 | 7/2012 | Hartenstein et al. |

FOREIGN PATENT DOCUMENTS

| | | | | |
|---|---|---|---|---|
| DE | 10 2004 049 354 A1 | 4/2006 | | |
| DE | 102009047978 A1 * | 4/2011 | ........... | H05K 9/0045 |
| GB | 2372899 A * | 9/2002 | ............. | H01Q 1/242 |

OTHER PUBLICATIONS

Laird: Emerson & Cuming Microwave Products; Eccosorb LS; lossy, flexible Foam Microwave Absorber, Sep. 2014, 2 pages.

Response to Office Action filed on Sep. 10, 2015 for counterpart German Patent Application No. DE 10 2015 100 519.0.

Notice to Grant received on Jan. 12, 2016 for counterpart German Patent Application No. DE 10 2015 100 519.0, including English language translation of relevant portions thereof.

Office Action issued on Apr. 22, 2015 in related German patent application No. 10 2015 100 519.0 (7 pgs.) as well as English language translation of relevant portions thereof (4 pgs.); 11 pages total.

Response to Office Action filed Sep. 10, 2015 in related German Application No. 10 2015 100 519.0 (8 pgs.) as well as English language translation of relevant portions thereof (7 pgs.); 15 pages total.

* cited by examiner

HOUSING FOR A MOBILE TELEPHONE

CROSS-REFERENCE TO RELATED APPLICATIONS

This application claims priority both to German Patent Application No. 10 2015 000 062.4, filed on Jan. 12, 2015, entitled "Housing for a Mobile Telephone", and to German Patent Application No. 10 2015 100 519.0, filed on Jan. 14, 2015, published as DE 10 2015 100 519 B3, which are incorporated herein by reference in entirety.

BACKGROUND

Field

Innovations herein relate to a housing having a housing wall, wherein an inner chamber is formed in the housing, and is formed and enclosed by the housing wall and into which a mobile telephone can be inserted. The invention also relates to a method for manufacturing the housing for the mobile telephone and to a method for attenuating a mobile radio signal of the mobile telephone.

OVERVIEW

With respect to the quality assurance and optimization of mobile radio networks, it is known from the prior art to repeatedly establish voice and data connections from a mobile telephone to different destinations in order to draw conclusions regarding the quality of the utilized mobile radio network, for example, on the basis of the measured call set-up time or the speed of an Internet connection. Mobile telephones which can be acquired by end users are utilized in order to design the measurements to be preferably realistic. In a so-called "drive test", in which repeated measurements are carried out along a predetermined driving route, the mobile telephones are disposed within a measuring vehicle, wherein the mobile telephones are provided with external antennas disposed outside the measuring vehicle, however, in order to create preferably comparable conditions for different network operators. Such antennas are installed, for example, in a roof box of the measuring vehicle and are connected to the mobile telephone by means of a coaxial cable.

Mobile telephones which are currently offered are less and less commonly provided with an external antenna connection for connecting the coaxial cable, however, and therefore the coaxial cable must be manually connected to the mobile telephone, for example, via soldering in many cases. In addition, mobile telephones which are currently offered often comprise different internal antennas for different mobile radio standards which, on the one hand, makes the connection extremely complicated and, on the other hand, requires that a multiplicity of external antennas be present for the preferably exact simulation of the transmission/reception behavior of the internal antennas. Since the mobile radio standards currently in use utilize different frequencies, for example, 806 MHz with LTE800 up to 2630 MHz with LTE2600, different attenuations also result due to the frequency-dependence of the coaxial cables, which attenuations, including a constant attenuation of 6 dB for simulating, for example, telephone calls made inside buildings, vary in the range from 9.7 dB up to 14.5 dB at the aforementioned frequencies, which not infrequently results in a corruption of the measuring results.

Proceeding therefrom, a goal of the invention is to provide a way of obtaining a defined and preferably constant attenuation of a mobile radio signal, in particular of electromagnetic radiation generated and/or received by a mobile telephone, in an especially simple way.

The goal of the invention is accomplished by the features of the independent claims. Preferred developments are specified in the dependent claims.

Accordingly, the goal is accomplished by a housing having a housing wall comprising a polymer including electrically conductive particles, wherein an inner chamber is provided in the housing, and is formed and enclosed by the housing wall and into which a mobile telephone can be inserted, and the housing wall is designed to attenuate a mobile radio signal of the mobile telephone by $\geq 3$ dB, as compared to unobstructed propagation, on the side of the housing wall facing away from the inner chamber.

Thus, an essential point of one or more implementations of the inventions herein is that the mobile telephone inserted into the housing is enclosed by the housing wall. The mobile radio signal is attenuated by the housing wall designed as a polymer including electrically conductive particles. The attenuation is largely independent of the frequency, and therefore a very similar attenuation or even the same attenuation is always achieved with different mobile radio standards having different frequencies. Constant attenuation can therefore be obtained in an especially simple way, which results in measuring results which are of higher quality and can be directly compared with one another at different frequencies.

The side of the housing wall facing away from the inner wall refers to a location outside the housing, for example 10 cm, 50 cm or 1 m away from the mobile telephone. Unobstructed propagation refers to a location more or less in the direct range of visibility of the mobile telephone, which is located, for example, 10 cm, 50 cm or 1 m away from the mobile telephone, wherein the mobile telephone is not disposed in the housing. When the mobile telephone is inserted in the housing, the mobile telephone is preferably completely enclosed by the housing wall, wherein it can also be possible, however, that the inner chamber has an opening, i.e., only partially encloses the mobile telephone. The mobile radio signal refers, in particular, to an electromagnetic radiation which is generated and/or received by the mobile telephone and forms between the mobile telephone and a base station of a network operator, for example, during a voice and/or data connection according to the mobile radio standard LTE800, GSM900, GSM1800, LTE1800, UMTS2100 or LTE2600.

According to a preferred embodiment, the housing wall is designed to attenuate the mobile radio signal, in particular an electromagnetic radiation which is generated and/or received by the mobile telephone, by $\geq 5$ dB and $\leq 15$ dB, preferably by $\geq 7$ dB and $\leq 13$ dB, very particularly preferably by 12 dB. Other ranges are also conceivable, which are formed from the group $\geq 3$ dB, $\geq 4$ dB, $\geq 5$ dB, $\geq 6$ dB, $\geq 7$ dB, $\geq 8$ dB, $\geq 9$ dB or $\geq 10$ dB, or $\leq 10$ dB, $\leq 11$ dB, $\leq 12$ dB, $\leq 13$ dB, $\leq 14$ dB, $\leq 15$ dB, $\leq 20$ dB, $\leq 30$ dB, $\leq 40$ dB or $\leq 50$ dB. One embodiment having relatively low attenuation is advantageous in the case of a measurement inside a building, whereas a relatively great attenuation is advantageous in the case of a measurement in a measuring vehicle within the scope of a so-called "drive test". In the case of the latter measurement, the housing is preferably disposed on a side window or in a roof box of the measuring vehicle.

In theory, the housing can be designed in various ways. For example, the housing can be designed in the shape of a cube or can be spherical. According to a particularly preferred embodiment, the housing wall has a housing base and preferably four housing side walls in such a way that the inner chamber is designed preferably having a cuboid shape or as a cuboid. The housing side walls are preferably gaplessly connected to the housing base and extend away therefrom at a right angle. The cuboid inner chamber can be left open, so that the mobile telephone can be inserted into and removed through the opening into the inner chamber in an especially simple way.

According to a particularly preferred embodiment, the housing wall comprises a housing cover for covering the inner chamber, wherein the housing cover is preferably held on a housing side wall so as to be pivotable or foldable. In the closed position, the housing cover preferably rests on at least one or all housing side walls, wherein it is also possible, however, that the housing cover comes to rest at a distance from the housing side wall. In an alternative embodiment, the housing cover can be fastened on the side wall by means of a hook and loop fastener, a hinge, or any other type of fastening means known from the prior art. The housing cover preferably has a planar extension which is the same size as the housing base.

In order provide dimensional stability for the housing cover and/or the housing base, a cover plate or a base plate can be provided, which are advantageously made from a plastic having a thickness of, for example, 2 mm or 4 mm and which are connected, with contact, to the housing cover or the housing base on the side facing away from the inner chamber, in particularly being bonded thereto. In another advantageous way, a side plate is provided, which is made from a plastic having a thickness of, for example, 4 mm and which, on the one hand, is connected to the base plate at a right angle in a fixed manner and, on the other hand, is connected to the cover plate so as to be pivotable. The housing side wall is preferably connected to the side plate with contact, in particular being bonded thereto.

According to a preferred development, a housing intermediate element made from the polymer including electrically conductive particles is provided, which housing intermediate element forms another inner chamber in the housing, into which another mobile telephone can be inserted. The housing intermediate element preferably rests against the housing base and/or the housing side walls with contact. Particularly preferably, a plurality of housing intermediate elements is provided, which form two, four, six or eight inner chambers, so that four, six or eight mobile telephones can therefore be accommodated in the housing.

In a further advantageous way, the mobile telephones are attenuated with respect to one another and are decoupled or partially shielded with respect to one another by means of the housing intermediate element located between said mobile telephones, so that a compact design of the housing can be obtained. In the arrangements known from the prior art, the mobile telephones must be positioned in the measuring vehicle with sufficient separation, which is very difficult, in particular, given a multiplicity of mobile telephones ($\geq 4$) in a measuring vehicle: The reason for this is that, in order to perform a high-quality measurement, the same reception conditions must be created for each mobile telephone with respect to the surroundings and, simultaneously, a minimum separation (of multiple times 10 cm) between the mobile telephones must be maintained.

By means of the proposed accomplishment, the mobile telephones can be positioned with a separation of a very few cm away from one another, however, so that substantially more mobile telephones can be used in a measuring vehicle given the same space requirement. In other words, a plurality of mobile telephones can be operated in a single housing, each of which undergoes a preferably identical or even the same attenuation of its mobile radio signal. Thus different mobile radio networks can be measured simultaneously, wherein the measuring results can be directly compared to one another given that the attenuation is the same or approximately the same in every case.

According to a preferred development, a telephone spacing element disposed on the housing wall is provided, which telephone spacing element is intended to form an air gap between the mobile telephone and the housing wall when a mobile telephone is inserted in the inner chamber. According to an even more preferred development, a cover spacing element is provided, which is intended to form an air gap at least between a housing side wall and the housing cover when the inner chamber is covered with the housing cover. The telephone spacing element and/or the cover spacing element is preferably designed as an adhesive pad provided in the inner chamber on the housing base, on the housing cover, on the housing walls and/or on the housing intermediate element, for example, as a rectangular or round adhesive pad made from plastic, although other means are also conceivable.

In theory, there are different ways to design the housing wall with the polymer including electrically conductive particles. Particularly preferably, the housing wall is impregnated with a soot dispersion, the housing wall comprises a layer which includes carbon particles and has a specific resistance of $\geq 10^{-3}$ ohm cm to $\leq 10^8$ ohm cm and/or the housing wall is made from a polyurethane foam which has a relative wave impedance of $\geq 0.13$ and $\leq 0.83$, measured at a frequency of 3 GHz. The impregnation with the soot dispersion is preferably carried out such that a polyurethane foam is impregnated with a latex containing soot particles, whereby the soot preferably comes to rest only on the surface of the polyurethane foam and, after the dispersion dries, the latex binds the soot as a binding agent.

Particularly preferably, the housing wall is made from the polyurethane foam sold under the brand name ECCOSORB LS, wherein, particularly advantageously, ECCOSORB LS in the specification LS-26 is used. The housing wall therefore has an attenuation of preferably 16 dB/cm and a relative wave impedance of $\geq 0.18$, measured at a frequency of 3 GHz and using the measuring process known to the person skilled in the art. Instead of carbon particles, it is also possible to use polymers having metal particles and/or nanoparticles, wherein the use of carbon particles, in particular soot, is substantially more cost-effective. The specific resistance can be determined on the basis of the standard ASTM D 257. The resistance is preferably in a range from $\geq 10^{-2}$ ohm cm to $\leq 10^6$ ohm cm, further preferably in a range from $\geq 10^{-1}$ ohm cm to $\leq 10^5$ ohm cm. The layer thickness of the layer including the carbon particles, which is required for calculating the specific resistance, can be ascertained from electron microscopic cross-section photographs.

According to a further preferred embodiment, the housing comprises the mobile telephone and a plurality of telephone spacing elements designed such that an air gap is formed between all the housing side walls, the housing base and, when the inner chamber is covered with the housing cover, the housing cover and the housing intermediate element as well, and the mobile telephone is fixed in the inner chamber. To this end, the mobile telephone preferably rests against the particular telephone spacing element with contact, so that the mobile telephone is held in a predefined positioned by the telephone spacing elements when the housing is transported. In theory, the mobile telephone can be designed as any type of mobile telephone, such as, for example, a smartphone, which advantageously transmits and receives mobile radio signals according to the mobile radio standards GSM, UMTS and LTE.

The goal of the invention is also accomplished by a method for manufacturing a housing for a mobile telephone, comprising the steps:

Providing a layer of a polymer, which includes electrically conductive particles, as a housing base;

Connecting another layer of the planar polymer, which includes electrically conductive particles, as housing side walls to the housing base in such a way that an inner chamber having a preferably cuboid shape is formed, into which the mobile telephone can be inserted; and Covering the inner chamber with another layer of the planar polymer, which includes electrically conductive particles, as the housing cover, wherein the housing base, the housing side walls, and the housing cover made from the polymer, which includes electrically conductive particles, are designed in such a way that a mobile radio signal of the mobile telephone is attenuated by ≥3 dB, as compared to unobstructed propagation, on the side of the housing wall facing away from the inner chamber.

The layers of the planar polymer, which includes electrically conductive particles, are preferably made from the polyurethane foam sold under the brand name ECCOSORB LS, in particular according to the specification LS-26, by means of which an attenuation of 16 dB/cm and a relative wave impedance Z/Z0 of 0.18 at a frequency of 3 GHz or 34 dB/cm and a relative wave impedance Z/Z0 of 0.31 at a frequency of 10 GHz are achieved. The thickness of the layers is preferably 0.25" or 6.35 mm, wherein it is further preferred for two further layers to be used for forming the housing side walls, which layers are disposed over one another with contact. Particularly preferably, the individual layers for forming the housing base, the housing side walls, and the housing cover are cut from a layer of ECCOSORB LS.

Finally, a goal of one or more aspects of the inventions herein is also accomplished by a method for attenuating a mobile radio signal of a mobile telephone, comprising the steps:

Providing a housing as described above;
Inserting the mobile telephone into the inner chamber; and
Covering the inner chamber with the housing cover.

In an advantageous way, the method results in a largely frequency-independent attenuation of the mobile radio signal of the mobile telephone, so that different mobile radio standards, each having different frequencies, can be measured in a directly comparable manner using a single mobile telephone, or different mobile radio networks, optionally also with different mobile radio standards each having different frequencies, can be measured in a directly comparable manner using a plurality of mobile telephones provided in an inner chamber.

For the person skilled in the art, other embodiments and advantages of the aforementioned methods follow by analogy with the previously described housing.

The invention is explained in detail below on the basis of a preferred embodiment, which makes reference to the attached drawing.

BRIEF DESCRIPTION OF THE DRAWINGS

FIG. 1 shows a side view of a housing according to a preferred embodiment of the invention. The housing comprises a housing wall 1, which includes a housing base 2, four housing side walls 3, and a housing cover 4. The housing side walls 3 extend, having contact with one another, perpendicularly away from the housing base 2 and, together with three housing intermediate elements 5, which likewise extend, having contact with one another, perpendicularly away from the housing base 2, form four inner chambers 6, each of which has a cuboid shape and which are shown in FIG. 1 using dashed lines. The four inner chambers 6 can be covered by the housing cover 4, wherein the housing cover 4 is shown in FIG. 1 in a partially opened position having an opening angle of approximately 30° and, in the top view of the housing in FIG. 2, is shown in an opened position having an opening angle of approximately 180°, wherein the angle is measured between the planar extension of the housing cover 4 and the housing base 2 in each case. The width of the housing side wall 3 shown in a top view in FIG. 1 is 249 mm, while the length of the housing side wall 3 is 385 mm. The height of the housing side wall 3, including the housing base 2, is 19 mm. Each inner chamber 6 has a width of 85 mm and a length of 155 mm and a depth of 12.7 mm.

DETAILED DESCRIPTION OF ILLUSTRATIVE IMPLEMENTATIONS

Figure 1:
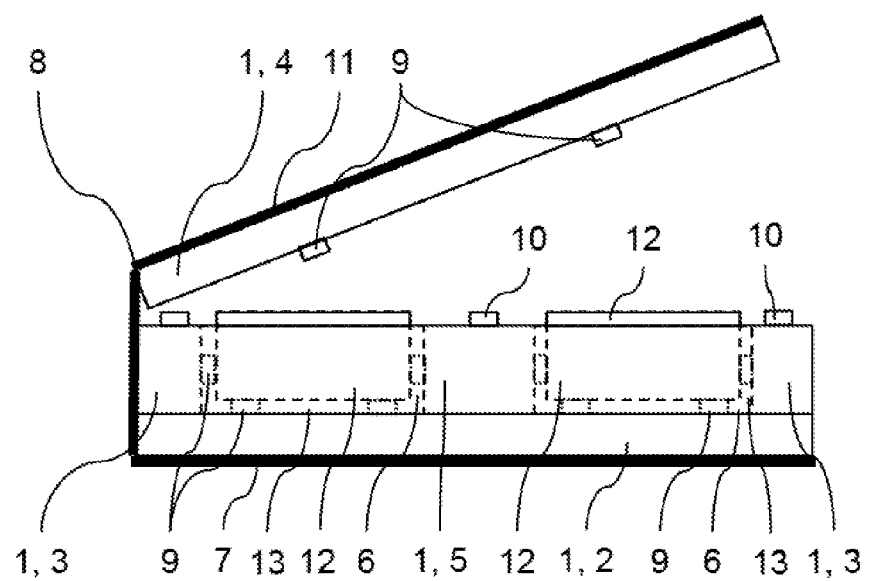
FIG. 1 shows a side view of a housing according to a preferred embodiment of the invention.
Figure 2:
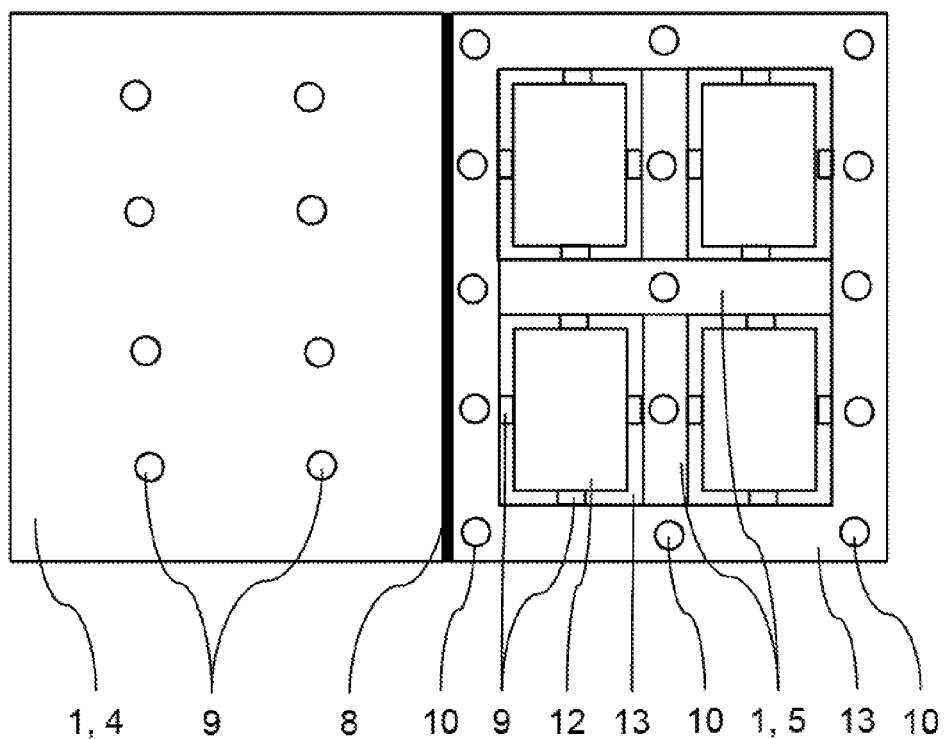
FIG. 2 shows a top view of the housing shown in FIG. 1.

The housing base 2, the housing side walls 3, the housing cover 4, and the housing intermediate elements 5 are made from a polymer including electrically conductive particles, wherein the polyurethane foam sold under the brand name ECCOSORB LS is used in this case, which polyurethane foam has been impregnated with a latex containing soot particles. After the dispersion dries, the latex therefore functions as a binding agent for fixing the soot, with the result that an attenuation of electromagnetic waves is effectuated, as further explained in the following. Specifically, ECCOSORB LS in the specification LS-26 is used, which is characterized by an attenuation of 16 dB/cm and a relative wave impedance Z/Z0 of 0.18 at a frequency of 3 GHz and an attenuation of 34 dB/cm and a relative wave impedance Z/Z0 of 0.31 at a frequency of 10 GHz. ECCOS ORB LS in the specification LS-26 has a thickness of 0.25" or 6.35 mm, wherein the polyurethane foam plates are typically available in sizes of 24"×24" or 61 cm×61 cm.

In order to produce the housing, layers of the polyurethane foam plates are cut mechanically or manually, for example, by means of a sharp knife, into the aforementioned dimensions for forming the housing base 2, the housing side walls 3, the housing cover 4, and the housing intermediate elements 5. Advantageously, initially a base plate 7 made from a plastic having a thickness of 4 mm and a width of 249 mm and a length of 385 mm is welded at a right angle to a side plate 8 made from a plastic having a thickness of 4 mm, a width of 30 mm, and a length of 385 mm using a welding wire comprising polyethylene by means of a welding attachment of a hot air dryer or the like. The common outer edge of the base plate 7 and the side plate 8 is welded without addition of welding wire. In order to provide better fixation of the polyurethane foam plates, the inner side of the side plate 8 is made adhesive using double-sided adhesive tape which is sold, for example, under the brand name 3M 9527, width 19 mm.

The housing base 2, which is cut to fit, is bonded onto the base plate 7 in alignment on the right, as the first layer. Two other layers of the polyurethane foam plates are bonded, with an adhesive known to the person skilled in the art, on the housing base 2 for forming the particular housing side walls 3. In the inner chambers 6 and on the housing cover 4 facing the inner chamber 6, multiple telephone spacing elements 9 are provided on the housing base 2, the housing side walls 3, the housing cover 4, and the housing intermediate elements 5. The telephone spacing elements 9 provided on the housing side walls 3 and on the housing intermediate elements 5 are designed as angular adhesive pads, which are sold under the brand name 3M Zb 19, while the telephone spacing elements 9 provided on the housing cover 4 and on the housing base 2 are designed as round adhesive pads which are sold under the brand name 3M Sj5744.

Cover spacing elements 10, which face the housing cover 4, are provided on the top layer of the polyurethane foam plates forming the housing side walls 3 and the housing intermediate elements 5, said cover spacing elements also being designed, in this case, as round adhesive pads which are sold under the brand name 3M Sj5744. Thus covered, the housing cover 4, in its non-illustrated closed position, covers the inner chambers 6 and rests on the cover spacing elements 10, wherein an air gap is formed between the housing side walls 3 and the housing cover 4 due to the cover spacing elements 10.

The housing cover 4 is bonded onto a cover plate 11 made from a plastic having a thickness of 2 mm, a width of 245 mm, and a length of 385 mm. The housing cover 4 and the cover plate 11 are pivotably fastened on the side wall 8 by means of a non-illustrated hinge band which extends along the entire length and is sold, for example, under the brand name Kavan 0382, in order to therefore design a book-like housing for accommodating a mobile telephone 12. In the closed position, the housing cover 4 lies congruently on the housing base 2. Non-illustrated cable bushings for electrically connecting the mobile telephones 12 can be incorporated in the housing side walls 3, for example, in order to route a USB cable from outside the housing into the housing.

One mobile telephone 12, which is the mobile telephone 12 offered under the brand name Samsung Galaxy S5 in this case, is inserted in each of the four inner chambers 6. When the housing cover 4 is closed, each mobile telephone 12 rests against one of the telephone spacing elements 9, with contact, on each side thereof and is thus fixed in position in the particular inner chamber 6. An air gap 13 is therefore formed between each mobile telephone 12 and the housing cover 4, the housing base 2, the particular housing side walls 4, and the housing intermediate elements 5.

Due to the dimensions and the material composition selected for the housing in this case, a mobile radio signal of the mobile telephone 12 is attenuated by 13 dB, as compared to unobstructed propagation, on the side of the housing wall 1 facing away from the inner chamber 6, i.e., outside the housing. The mobile radio signal includes the electromagnetic radiation, which is generated and/or received by the mobile telephone 12, for example, according to the mobile radio standard GSM900, GSM1800 or UMTS2100. The measurement is preferably carried out at a distance of 10 cm, 50 cm or one meter from the mobile telephone 12 by means of processes and methods, which are known to the person skilled in the art, for determining the electromagnetic radiation generated and/or received by a mobile telephone 12.

Depending on the dimensions of the housing and the material composition, other attenuations can also be achieved, such as, for example, in the range from $\geq 3$ dB and $\leq 15$ dB. The attenuation can be influenced by the thickness of the housing cover 4, the housing base 2, the housing side walls 4, and housing intermediate elements 5 or by selecting another specification of the polyurethane foam ECCOSORB LS used for the housing wall 1 in this case, such as, for example, the specification LS-14, LS-18, LS-20 or LS-30. The attenuation can also be influenced by the size of the air gap between the housing cover 4 and the housing side walls 3. In addition to a polymer, which includes electrically conductive particles, as the housing wall 1 having carbon particles, it is also possible to use polymers including metal particles and/or nanoparticles.

What is claimed is:

1. A housing comprising:
    a housing wall comprising a polymer including electrically conductive particles,
        wherein an inner chamber is provided in the housing, and is formed and enclosed by the housing wall, the inner chamber being shaped to receive a mobile telephone, and
        wherein the housing wall is designed to attenuate a mobile radio signal of the mobile telephone by $\geq 3$ dB and $\leq 15$ dB, as compared to unobstructed propagation, on the side of the housing wall facing away from the inner chamber.

2. The housing of claim 1, wherein the housing wall is designed to attenuate the mobile radio signal, including electromagnetic radiation which is generated and/or received by the mobile telephone by $\geq 7$ dB and $\leq 13$ dB.

3. The housing of claim 1, wherein the housing wall comprises a housing base and four housing side walls and is arranged in such a way that the inner chamber is designed having a cuboid shape.

4. The housing of claim 1, wherein the housing wall comprises a housing cover for covering the inner chamber and the housing cover is pivotably held on the housing side wall.

5. The housing of claim 4, further comprising a cover spacing element which forms an air gap at least between a housing side wall and the housing cover in an arrangement of the housing where the inner chamber is covered with the housing cover.

6. The housing of claim 5, further comprising a plurality of telephone spacing elements formed, with the mobile telephone, in such a way that an air gap is formed between all the housing side walls, the housing base and, in an arrangement where the inner chamber is covered with the housing cover, the housing cover, and
    wherein the mobile telephone is fixed in the inner chamber.

7. The housing of claim 6, wherein the housing wall is designed to attenuate the mobile radio signal, including electromagnetic radiation which is generated and/or received by the mobile telephone by $\geq 7$ dB and $\leq 13$ dB.

8. The housing of claim 7, wherein the housing wall comprises a housing base and four housing side walls and is arranged in such a way that the inner chamber has a cuboid shape.

9. The housing of claim 8, wherein the housing wall comprises a layer which includes carbon particles and has a specific resistance of $\geq 10^{-3}$ ohm cm to $\leq 10^8$ ohm cm.

10. The housing of claim 9, wherein the housing wall comprises a polyurethane foam which has a relative wave impedance of $\geq 0.13$ and $\leq 0.83$, measured at a frequency of 3 GHz.

11. The housing of claim 1, further comprising a housing intermediate element made from the polymer including electrically conductive particles, wherein the housing intermediate element forms another inner chamber in the housing, the another inner chamber having peripheral elements that are sized and arranged to create an orfice into which another mobile telephone is housed when inserted.

12. The housing of claim 11, further comprising a plurality of telephone spacing elements formed, with the mobile telephone, in such a way that an air gap is formed between all the housing side walls, the housing base and, in an arrangement where the inner chamber is covered with the housing cover, the housing cover, and wherein the mobile telephone is fixed in the inner chamber.

13. The housing of claim 11, further comprising a cover spacing element which forms an air gap between a housing side wall and the housing cover in an arrangement of the housing where the housing cover is positioned directly over the inner chamber to cover the inner chamber.

14. The housing of claim 1, further comprising a telephone spacing element which is disposed on the housing wall forms an air gap between an edge of the mobile telephone and the housing wall.

15. The housing of claim 14, further comprising a cover spacing element which forms an air gap between a housing side wall and the housing cover in an arrangement of the housing where the housing cover is positioned directly over the inner chamber to cover the inner chamber.

16. The housing of claim 14, further comprising a plurality of telephone spacing elements formed, with the mobile telephone, in such a way that an air gap is formed between all the housing side walls, the housing base and, in an arrangement where the inner chamber is covered with the housing cover, the housing cover, and wherein the mobile telephone is fixed in the inner chamber.

17. The housing of claim 1, wherein the housing wall is impregnated with a soot dispersion, the housing wall comprises a layer which includes carbon particles and has a specific resistance of $\geq 10^{-3}$ ohm cm to $\leq 10^8$ ohm cm and/or the housing wall is made from a polyurethane foam which has a relative wave impedance of $\geq 0.13$ and $\leq 0.83$, measured at a frequency of 3 GHz.

18. The housing of claim 17, further comprising a plurality of telephone spacing elements formed, with the mobile telephone, in such a way that an air gap is formed between all the housing side walls, the housing base and, in an arrangement where the inner chamber is covered with the housing cover, the housing cover, and wherein the mobile telephone is fixed in the inner chamber.

19. A method for attenuating a mobile radio signal of a mobile telephone, comprising the steps:

providing a housing described in claim 1;
inserting the mobile telephone into the inner chamber; and
covering the inner chamber with the housing cover.

20. A method for manufacturing a housing for a mobile telephone, comprising the steps:

providing a layer of a polymer, which includes electrically conductive particles, as a housing base;
connecting another layer of the planar polymer, which includes electrically conductive particles, as housing side walls to the housing base in such a way that an inner chamber having a preferably cuboid shape is formed, into which the mobile telephone can be inserted; and
covering the inner chamber with another layer of the planar polymer, which includes electrically conductive particles, as the housing cover, wherein
the housing base, the housing side walls, and the housing cover made from the polymer, which includes electrically conductive particles, are designed in such a way that a mobile radio signal of the mobile telephone is attenuated by $\geq 3$ dB and $\leq 15$ dB, as compared to unobstructed propagation, on the side of the housing wall facing away from the inner chamber.

* * * * *